Aug. 29, 1950 H. M. BACH 2,520,823

OSCILLATOR FREQUENCY CONTROL

Filed April 10, 1946 3 Sheets-Sheet 1

Inventor
HENRY M. BACH

By Herman L. Gordon
Attorney

Aug. 29, 1950 H. M. BACH 2,520,823

OSCILLATOR FREQUENCY CONTROL

Filed April 10, 1946 3 Sheets-Sheet 2

Inventor
HENRY M. BACH

By Herman L. Gordon
Attorney

Aug. 29, 1950 H. M. BACH 2,520,823

OSCILLATOR FREQUENCY CONTROL

Filed April 10, 1946 3 Sheets-Sheet 3

Inventor
HENRY M. BACH

By Herman L. Gordon
Attorney

Patented Aug. 29, 1950

2,520,823

UNITED STATES PATENT OFFICE 2,520,823

OSCILLATOR FREQUENCY CONTROL

Henry M. Bach, Woodmere, N. Y., assignor to Premier Crystal Laboratories, Incorporated, New York, N. Y.

Application April 10, 1946, Serial No. 660,947

10 Claims. (Cl. 250—36)

This invention relates to oscillator frequency control and more particularly to a method and means for varying the frequency of an oscillator by electrical means.

The present invention is applicable to variation in frequency of an oscillator to be effected by means of a D. C. potential or by means of an alternating potential of audio or super-audio frequencies.

In a normal oscillator circuit a necessary condition for oscillation is that the real and imaginary current vectors must add up to zero. According to the present invention a harmonic of the oscillator frequency is amplified in accordance with the control potential and is impressed across the oscillator tank circuit. This (amplified) harmonic potential causes a current to flow in the tank circuit, said current chiefly tending to flow through the capacitor branch of the tank circuit. The oscillator, therefore, will adjust itself to a new frequency. Said new frequency will be lower than the original oscillator frequency since it will be compensatory to the unbalance caused by the increased current flowing through the tank capacitor. Said increased current flow produces at the terminals of the tank capacitor an increase in voltage. To increase the voltage at the terminals of the tank inductance to equal the capacitor voltage, as is required for oscillation, an increased current of fundamental frequency must flow through the tank inductance. The effect is the same as if the tank capacitance were increased, and this of course, would decrease the fundamental oscillator frequency.

By varying the amplitude of the injected harmonic frequency the frequency shift of the oscillator may be controlled. The variation of said harmonic frequency amplitude can be most easily effected by varying the bias on the control grid of the amplifier tube (which will vary its transconductance).

Manifestly, either an odd harmonic of the oscillator fundamental frequency, an even harmonic thereof, or a voltage containing any number of harmonics of said fundamental frequency may be employed.

It is a prime object of the present invention to provide a novel and improved method and means for controlling the frequency of an oscillator in accordance with the foregoing discussion.

It is a further object of the present invention to provide an improved method and means for controlling the frequency of an oscillator in accordance with a control potential.

A still further object of the invention is to provide an improved method and means for controlling oscillator frequency in accordance with a control potential wherein the frequency control medium is a harmonic voltage of the oscillator fundamental voltage.

A still further object of the invention is to provide improved methods and means for controlling the frequency of an oscillator employing feed back to the oscillator of a harmonic voltage of the oscillator fundamental voltage, said harmonic voltage being amplified in accordance with a control potential which may be either a D. C. potential or an alternating potential of audio or super-audio frequencies.

Further objects and advantages of the invention will become apparent from the following description and claims, and from the accompanying drawings, wherein:

Figure 1:
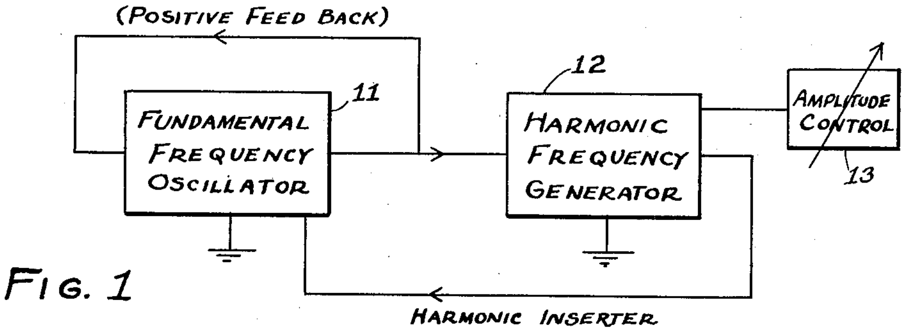
Figure 1 is a block diagram illustrating the basic principles and features of the present invention.

Figure 1 is illustrative of the basic principles of the present invention. In said figure, 11 designates the fundamental frequency oscillator (designated as operating with positive feed back), and 12 is a generator of a harmonic frequency derived from oscillator 11. A gain control device 13 is employed to control the amplitude of the harmonic frequency generated in element 12. The amplified harmonic frequency is fed back to oscillator 11 to control the frequency of the oscillator fundamental in the manner above described.

Figure 2:
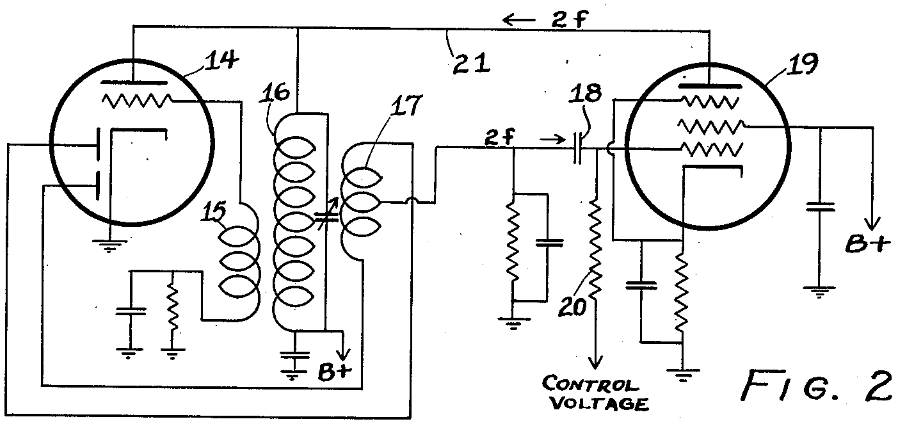
Figure 2 is a schematic wiring diagram illustrating a practical embodiment of the present invention employed in an oscillator circuit.

Referring to Figure 2, a practical circuit is disclosed employing the inventive concept discussed above. In this circuit 14 is a dual diode-triode tube, the triode section of which is employed as a tuned plate oscillator tube. Positive feed back to sustain oscillation is obtained by mutual inductance comprising a coil 15 in the grid circuit of the triode which is inductively coupled to the tank circuit coil 16. Also coupled to tank coil 16 is a coil 17 whose terminals are connected to the respective diode plates of tube 14. The center of coil 17 is connected through a D. C. blocking condenser 18 to the input grid of an amplifier tube 19. This arrangement results in full wave rectification of the oscillator voltage induced in coil 17, which provides at the input grid of tube 19 an alternating voltage of double frequency with respect to the fundamental frequency of the oscillator. The external control voltage is applied to the input grid of tube 19 through a grid resistor 20, providing a means of varying the transconductance of said tube. The amplified second harmonic signal is fed back from the plate of tube 19 to the tank circuit of the oscillator by a conductor 21, and the oscillator will then stabilize at a new frequency which depends upon the control voltage applied to the grid of tube 19.

It is to be noted that the above mentioned control voltage may be either a D. C. potential, such as is derived from an AFC discriminator, whereby the present invention may be employed as an automatic frequency control device to stabilize an oscillator at a desired frequency, or said control voltage may be an alternating potential to frequency-modulate the oscillator. Where the control voltage is an audio-frequency signal, the oscillator is frequency modulated in accordance therewith and may be employed as part of a frequency modulation transmitting system.

Figure 3:
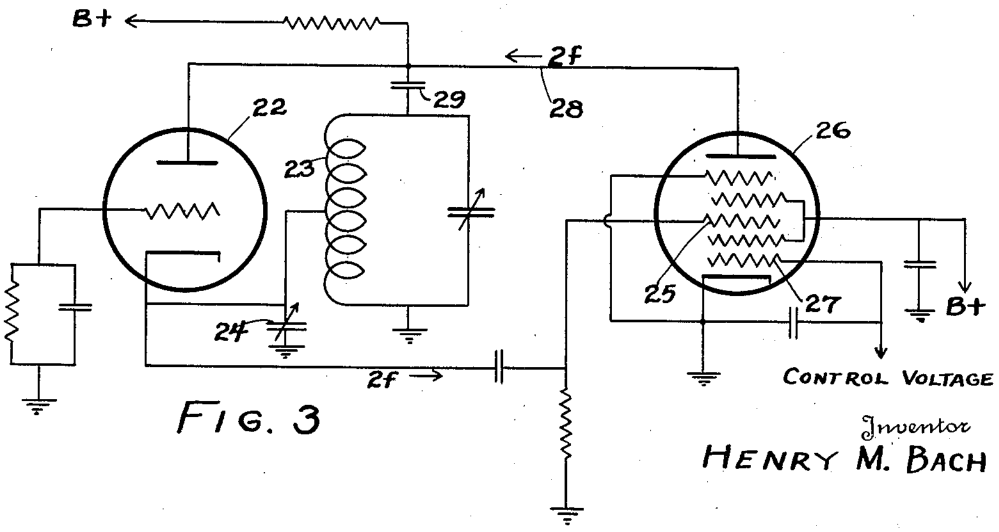
Figure 3 is schematic wiring diagram illustrating an alternative embodiment of the present invention.

In the embodiment of Figure 3, the oscillator tube 22 is a triode and the oscillator is of the well known Hartley type. A portion of the tank coil 23 is employed in conjunction with a tuning condenser 24 as a tuned input circuit for the input grid 25 of a harmonic amplifier tube 26. Condenser 24 is tuned to pass second harmonic signal energy from the oscillator circuit to input grid 25. The transconductance of tube 26 is controlled by an external control voltage applied to the control grid 27 of the tube, and the amplitude of the resultant A. C. signal (double in frequency with respect to the oscillator) available at the plate of tube 26 will depend upon the control voltage applied to grid 27. Said resultant A. C. signal is fed back to the tank circuit of the oscillator from the plate of tube 26 by a conductor 28 through a condenser 29 and will modify the fundamental frequency of the oscillator in the manner described above.

Figure 4:
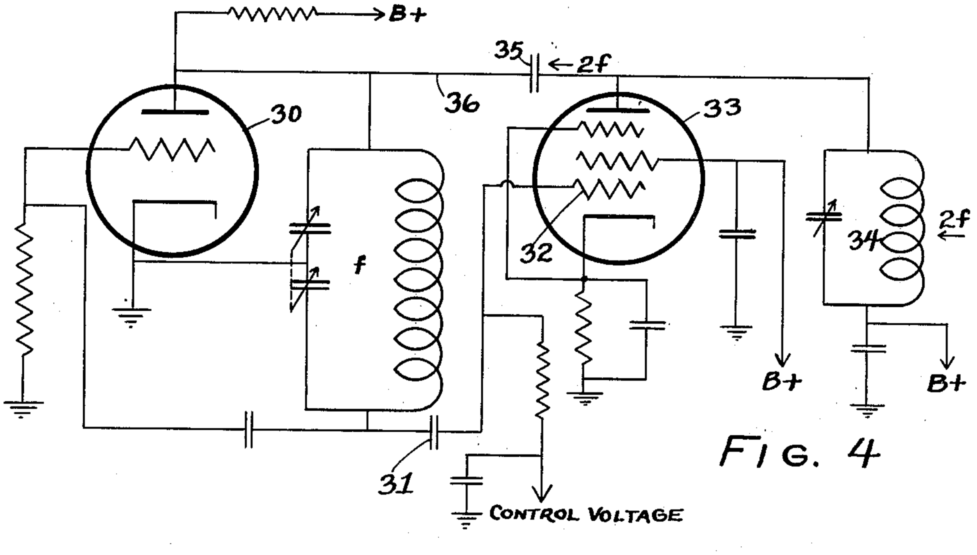
Figure 4 is a schematic diagram illustrating a further embodiment of the present invention.

In the embodiment of the invention disclosed in Figure 4 the oscillator tube 30 is a triode and the oscillator is of the well known Colpitts type. The alternating potential of fundamental frequency which appears at the grid of tube 30 is coupled through a D. C. blocking condenser 31 to the control grid 32 of an amplifier tube 33. The output circuit of tube 33 is tuned by a coil and condenser parallel network 34 to a resonance with the second harmonic of the oscillator. The amplified second harmonic is fed back to the tank circuit of the oscillator through a D. C. blocking condenser 35 and a conductor 36. The external control voltage, which controls the transconductance of tube 33 is applied through a grid resistor to control grid 32, thus controlling the amplitude of the second harmonic voltage available at the plate of the tube.

Figure 5:
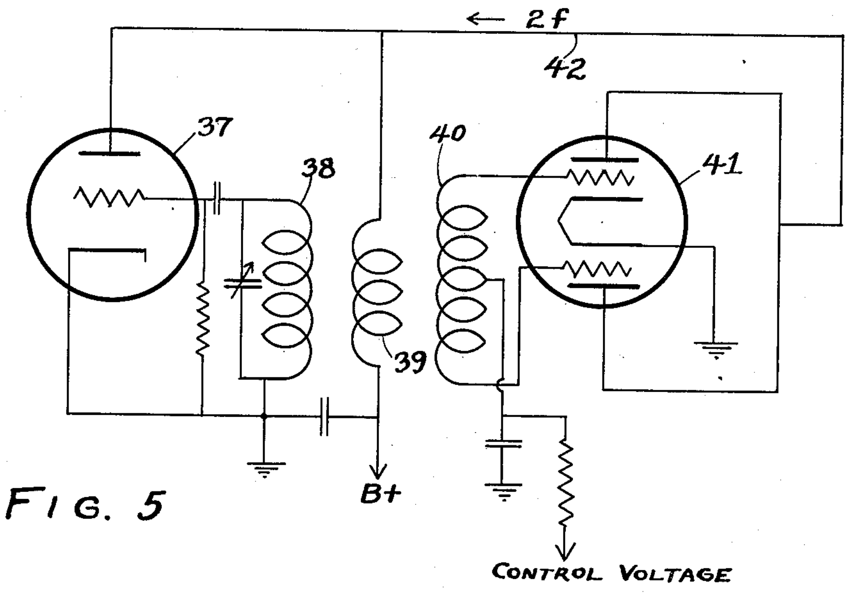
Figure 5 is a schematic wiring diagram illustrating a still further embodiment of the invention.

In Figure 5 a further embodiment of the invention is disclosed wherein the oscillator is of the "tickler feed-back," or tuned-grid type employing a triode 37 and wherein the positive feed back required to sustain oscillations is obtained by inductively coupling the grid coil 38, which is the tank inductance, to a plate coil 39. Inductively coupled with plate coil 39 is a center-tapped coil 40. The end terminals of coil 40 are each connected to an input grid of a dual triode tube 41. The external control voltage is applied to the center tap of coil 40. As a consequence, full-wave rectification and amplification of the input signal occurs in tube 41. The plates of the tube are connected together and the rectified signal, which is double the fundamental frequency is fed back to the plate coil 39 by a conductor 42. The amplitude of the double frequency component thus fed back is controlled by the erternal control voltage, since said control voltage is in control of the transconductance of tube 41. Said double frequency component is introduced into the tank circuit of the oscillator by the inductive coupling between plate coil 39 and tank coil 38. The fundamental frequency will therefore be varied in accordance with the control potential as above described.

Figures 6, 7:
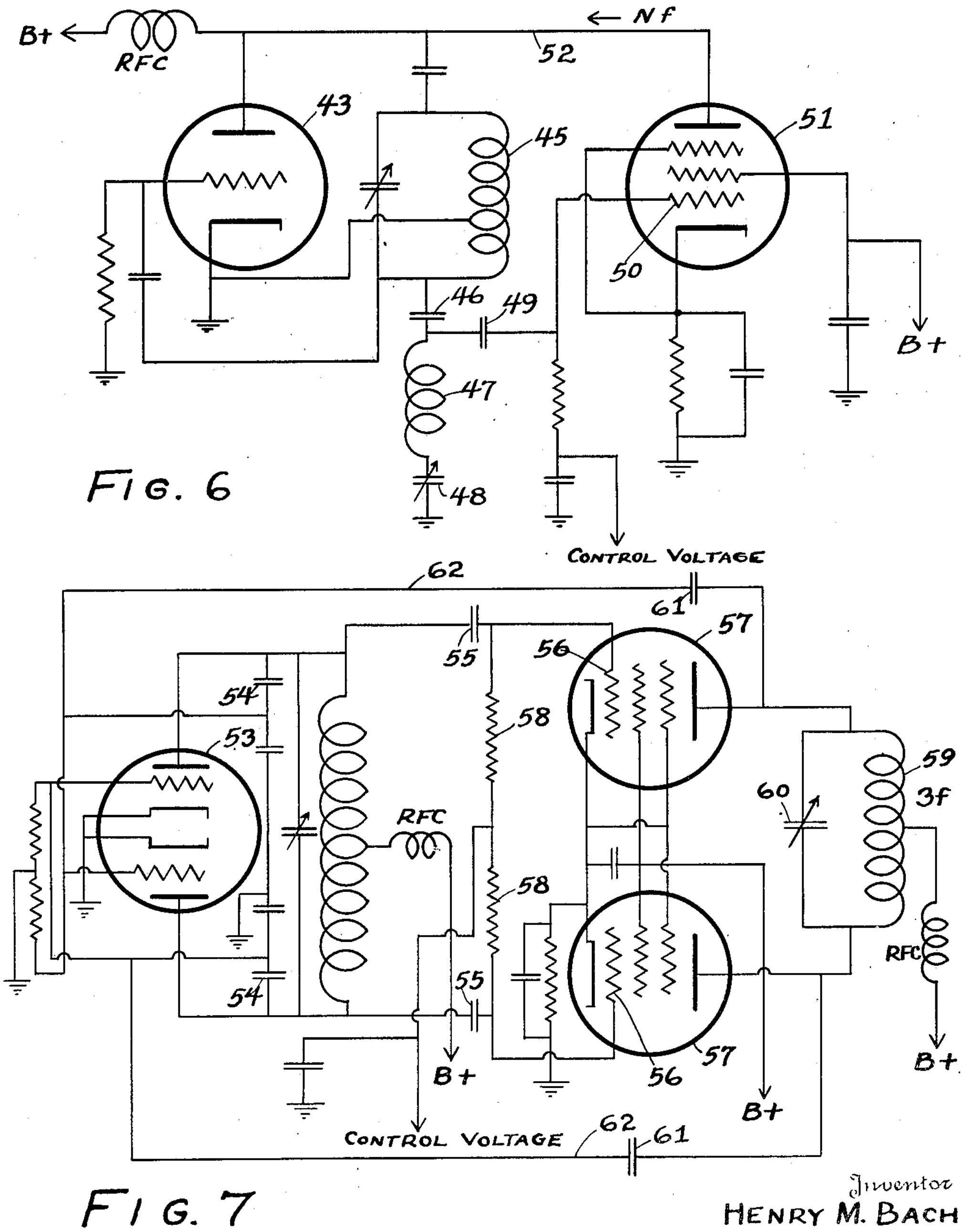
Figure 6 is a schematic diagram of an extended embodiment of the invention adapted to employ a plurality of the higher harmonics of the oscillator frequency as the frequency control medium.
Figure 7 is a schematic diagram of a further embodiment of the invention employing odd harmonic frequencies of the fundamental frequency as the control medium.

In the embodiment of the invention disclosed in Figure 6, a triode tube 43 is employed in an oscillator circuit of the Hartley type. The grid terminal of the tank coil 45 is connected through a D. C. blocking condenser 46 to a tuned filter comprising a coil 47 and a variable condenser 48 in series with coil 47. The filter may be tuned by varying condenser 48 to series resonance with the fundamental oscillator frequency to thus by-pass said fundamental and to separate the fundamental from the remaining higher harmonic components of the oscillator voltage at this point in the circuit. Said remaining harmonic components are coupled through a capacitor 49 to the input grid 50 of an amplifier tube 51. The external control voltage is applied to grid 50 through a suitable grid resistor. As in the previous embodiments described above the transconductance of tube 51 is controlled by the external control voltage applied to grid 50 and the amplitudes of the amplified higher harmonic components appearing at the plate of tube 51 are likewise controlled thereby. Said amplified harmonic components are applied to the tank circuit of the oscillator by a conductor 52 and provide control action of the fundamental frequency in the same manner as in the previously described embodiments of the present invention.

In the embodiment of the invention illustrated in Figure 7, the oscillator is of the push-pull type and employs a dual triode tube 53. The tank circuit is connected across the plates of the tube 53 and positive feed back for sustaining the oscillations is provided by coupling the plate of one section of the dual triode to the grid of the other section through a coupling capacitor 54, and vice-versa. In this circuit even harmonics are balanced out and only odd harmonics are present in the resultant oscillations. Each plate of tube 53 is coupled through a coupling condenser 55 to an input grid 56 of one of a pair of amplifier tubes 57 connected in push-pull relationship. The external control potential is applied to each grid 56 through suitable grid resistors 58, 58. Connected across the plates of tubes 57, 57 is a tuning circuit comprising a coil 59 and a variable condenser 60 connected in parallel therewith. Plate voltage is applied to tubes 57, 57, at the center tap of coil 59. Condenser 60 is tuned so that the parallel combination of said condenser and coil 59 is preferably resonant to the third harmonic of the oscillator frequency (although it may be also tuned for other odd harmonics). The amplitude of the third harmonic potential appearing at each plate of the tubes 57, 57 will therefore be controlled by the external control potential applied to the grids 56, 56. Each of said plates is connected through a D. C. blocking condenser 61 and a conductor 62 to a respective grid of oscillator tube 53 and is thereby coupled to the oscillator tank circuit through a coupling condenser 54. The feed back of the third harmonic energy into the oscillator tank circuit controls the oscillator fundamental frequency in accordance with the applied external control potential in the same manner as previously described in connection with the preceding embodiments of the present invention.

Although certain specific embodiments of oscillator frequency control methods and means have been disclosed in the foregoing description, it will be understood that various other modifications within the spirit of the invention may occur to those skilled in the art. Therefore it is intended that no limitations be placed on the invention other than as defined by the scope of the appended claims.

What is claimed is:

1. In combination, an oscillator having a tank circuit, an external source of varying potential, means for deriving a frequency which is in harmonic relation to the fundamental frequency of the oscillator, means for controlling the amplitude of the harmonic frequency in accordance with the varying magnitude of the external potential, and means for feeding the harmonic frequency directly across a capacitive portion of the tank circuit of the oscillator.

2. In combination, an oscillator having a tank circuit, a source of varying control potential, means for doubling the fundamental frequency of the oscillator, means for variably amplifying the doubled frequency in accordance with said varying control potential, and means for feeding the amplified doubled frequency directly across a capacitive portion of the tank circuit of the oscillator.

3. In combination, an oscillator having a tank circuit, a source of varying control potential, means for deriving an odd harmonic of the fundamental frequency of the oscillator, means for controlling the amplitude of said odd harmonic in accordance with said varying control potential, and means for feeding said odd harmonic directly across a capacitive portion of the tank circuit of the oscillator.

4. In combination, an oscillator having a frequency determining network, a source of varying potential, means for deriving a frequency which is in harmonic relationship to the fundamental frequency of said oscillator, an amplifier for said harmonic frequency, means for controlling the amplification of said amplifier in accordance with said varying potential, and means for feeding the amplified harmonic frequency directly across a capacitive portion of said frequency determining network.

5. The structure of claim 4, and wherein the derived harmonic frequency is double the fundamental frequency of the oscillator.

6. The structure of claim 4, and wherein the derived harmonic frequency is an odd integral multiple of the fundamental frequency of the oscillator.

7. A method of varying the frequency of an oscillator comprising filtering out the fundamental frequency of the oscillator, amplifying the remaining harmonic components in accordance with the amount of frequency variation desired, and feeding the amplified harmonic components directly across a capacitive portion of the tank circuit of the oscillator.

8. A method of varying the frequency of an oscillator in accordance with a varying control potential comprising separating the fundamental from the other harmonic components of the generated oscillatory energy produced by the oscillator, modifying the amplitude of said other harmonic components in accordance with said varying control potential, and feeding the modified harmonic components directly across a capacitive portion of the tank circuit of the oscillator.

9. In combination, an oscillator having a tank circuit, a source of varying control potential, means for separating the fundamental frequency from the higher harmonic frequency energy produced by the oscillator, means for varying the amplitude of the higher harmonic frequency energy in accordance with said control potential, and means for feeding the higher harmonic energy directly across a capacitive portion of the tank circuit of the oscillator.

10. In combination, an oscillator having a frequency-determining network, a source of varying potential, means for deriving a frequency which is in harmonic relationship to the fundamental frequency of said oscillator, means for controlling the amplitude of the harmonic frequency in accordance with the varying potential, and means for introducing the harmonic frequency into said frequency-determining network.

HENRY M. BACH.

REFERENCES CITED

The following references are of record in the file of this patent:

UNITED STATES PATENTS

| Number | Name | Date |
|---|---|---|
| 1,878,252 | Taylor | Sept. 20, 1932 |
| 1,878,308 | Hansell | Sept. 20, 1932 |
| 2,076,264 | Chireix et al. | Apr. 6, 1937 |
| 2,082,813 | Wright | June 8, 1937 |
| 2,115,877 | Rocard | May 3, 1938 |
| 2,182,790 | Craft | Dec. 12, 1939 |
| 2,191,454 | Craft | Feb. 2, 1940 |
| 2,250,526 | Franke | July 29, 1941 |
| 2,447,248 | Harris | Aug. 17, 1948 |